US012744082B2

(12) United States Patent
Li et al.

(10) Patent No.: US 12,744,082 B2
(45) Date of Patent: Sep. 22, 2026

(54) MEMORY DEVICES INCLUDING TRI-STATE MEMORY CELLS

(71) Applicant: Micron Technology, Inc., Boise, ID (US)

(72) Inventors: Jiyun Li, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 18/393,334

(22) Filed: Dec. 21, 2023

(65) Prior Publication Data

US 2024/0282370 A1 Aug. 22, 2024

Related U.S. Application Data

(60) Provisional application No. 63/485,578, filed on Feb. 17, 2023.

(51) Int. Cl.
*G11C 11/56* (2006.01)
*G11C 11/4091* (2006.01)
*G11C 11/4094* (2006.01)

(52) U.S. Cl.
CPC ...... *G11C 11/5628* (2013.01); *G11C 11/4091* (2013.01); *G11C 11/4094* (2013.01)

(58) Field of Classification Search
CPC ........... G11C 11/5628; G11C 11/4091; G11C 11/4094
See application file for complete search history.

(56) References Cited

U.S. PATENT DOCUMENTS

2005/0174841 A1* 8/2005 Ho ........................ G11C 11/56 365/185.03
2017/0047113 A1* 2/2017 Kim .................. G11C 11/4091
2023/0395101 A1 12/2023 Li et al.

* cited by examiner

*Primary Examiner* — Uyen Smet
(74) *Attorney, Agent, or Firm* — TraskBritt

(57) ABSTRACT

Memory devices including tri-state memory cells are disclosed. A memory device may include a first tri-state cell that may store a first voltage level that is one of three voltage levels, a second tri-state cell that may store a second voltage level that is one of the three voltage levels, and three input/output lines that may access the memory device. The three input/output lines may carry three respective binary signals based on the first voltage level and the second voltage level. A memory device may include a bank including a number of continuous arrays of tri-state memory cells. Each of the tri-state memory cells may be accessible by a respective bit line. Groups of the bit lines may be associated with respective column-select lines. The bank may include a number of sub-word-line drivers interspersed between the number of continuous arrays. Associated systems and methods are also disclosed.

18 Claims, 4 Drawing Sheets

300
302
SWD 306
MAT 304
XDEC 308
Y
Z
X 408
406
304
404<5>
404<4>
404<3>
404<2>
404<1>
404<0>
407<5>
407<4>
407<3>
407<2>
407<1>
407<0>
402

MEMORY DEVICES INCLUDING TRI-STATE MEMORY CELLS

CROSS-REFERENCE TO RELATED APPLICATION

This application claims the benefit under 35 U.S.C. § 119(e) of U.S. Provisional patent application Ser. No. 63/485,578, filed Feb. 17, 2023, the disclosure of which is hereby incorporated herein in its entirety by this reference.

TECHNICAL FIELD

Embodiments of the disclosure relate to memory devices. More specifically, various embodiments relate to memory devices including tri-state memory cells. Additionally, embodiments include related methods, devices, and systems.

BACKGROUND

Memory devices are typically provided as semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
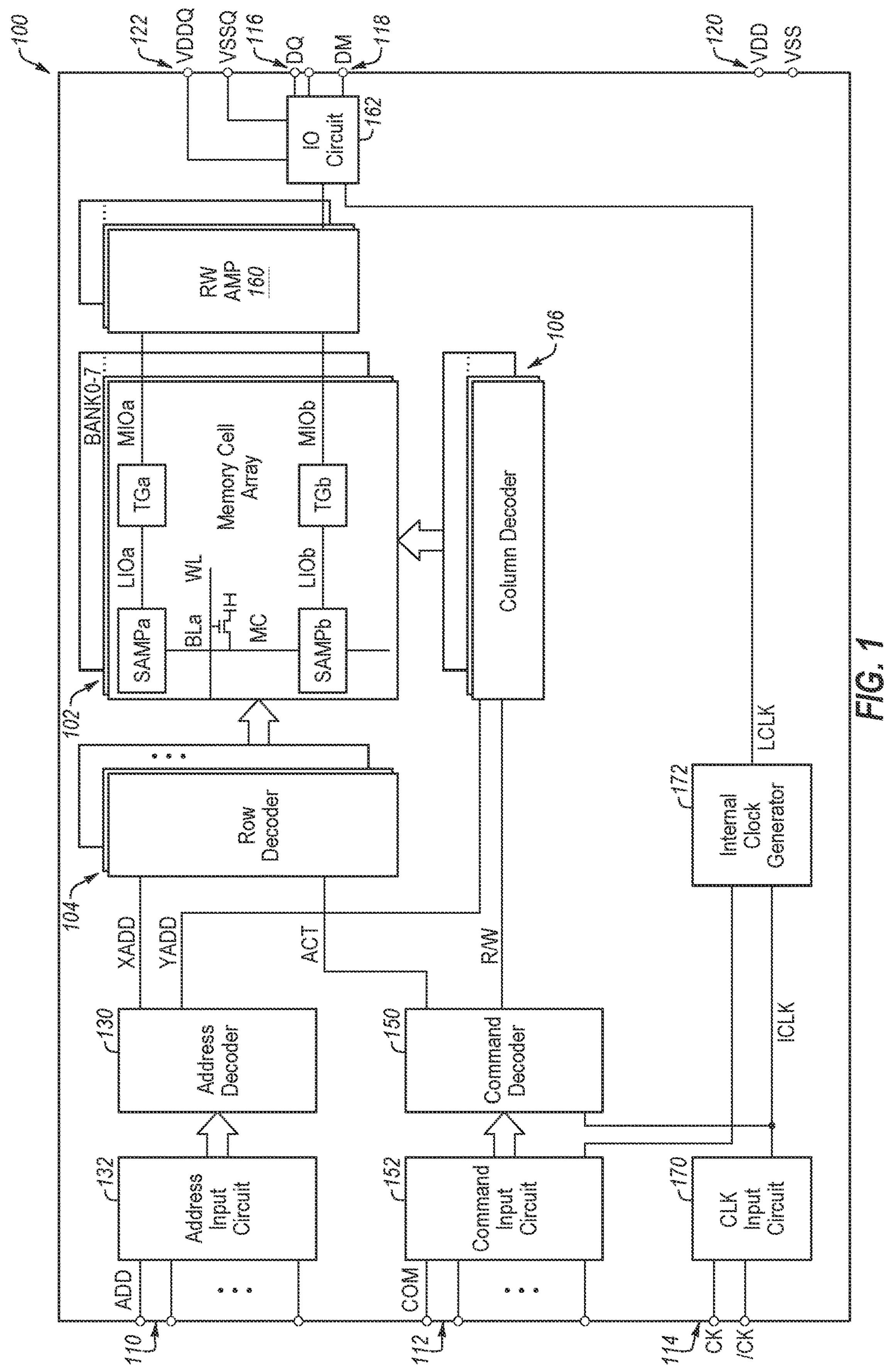
FIG. 1 is a functional block diagram illustrating an example memory device, in accordance with at least one embodiment of the disclosure.

Conventional memory devices include an array of binary memory cells that each store one of two voltage levels. The voltage level stored by each binary memory cell is representative of a binary value stored by the memory cell. For example, a binary memory cell may store a "high" voltage level which may be representative of a "1" or the binary memory cell may store a "low" voltage value which may be indicative of a "0."

A conventional memory device may read binary values from the array of binary memory cells by sensing voltage levels of the binary memory cells in the array and providing output signals indicative of the sensed voltage levels. Additionally, a conventional memory device may write binary values by receiving input signals indicative of the binary values to be written and setting voltage levels of the binary memory cells in the array according to the binary values to be written.

Some memory cells may store one of three voltage levels. In the present disclosure, a memory cell configured to store one of three voltage levels may be referred to as a "tri-state memory cell" or as a "tri-state cell." As an example, tri-state memory cells are described in U.S. application Ser. No. 17/805,090, filed Jun. 7, 2022, the disclosure of which is incorporated by reference in its entirety.

Despite some memory cells storing one of three voltage levels, many devices that access (e.g., write data to and/or read data from) memory devices (including, for example, memory controllers) may be configured to send binary input signals to and receive binary output signals from memory devices.

Some embodiments described herein relate to translating between voltage levels stored by tri-state memory cells and binary values, e.g., binary values to be provided or received as binary signals. For example, some embodiments relate to translating binary values received by the memory device (e.g., as part of a write operation) into voltage levels to be stored in tri-state memory cells. And some embodiments relate to translating voltage levels to be stored in tri-state memory cells into binary values to be provided by the memory device (e.g., as part of a read operation).

Some embodiments relate to translating between three binary values and two voltage levels stored by two respective tri-state memory cells. For example, as part of a write operation, a memory device may receive three binary signals indicative of three bits to be stored. The memory device may store the three bits as two voltage levels in the two respective tri-state memory cells. As another example, as part of a read operation, the memory device may provide three binary signals indicative of two voltage levels stored in the two respective tri-state memory cells.

A memory device including tri-state memory cells may have greater memory density than a conventional memory device including binary memory cells. For example, an array of binary memory cells may require one memory cell and one bit line per bit of memory capacity. Each memory cell and each bit line uses area of a die. Memory density refers to an amount of memory capacity per area. An array of tri-state memory cells, according to embodiments described herein, may require two memory cells and two bit lines per three bits of memory capacity. Thus, tri-state memory cells, according to embodiments described herein, may allow for 50% greater memory density than an array of conventional binary memory cells. The 50% increase in memory density of embodiments of this disclosure may allow for physically smaller memory devices that have the same memory capacity as larger conventional memory devices or for memory devices that are the same size as other memory devices, yet have a greater memory capacity.

Additionally, tri-state memory cells, according to embodiments described herein, may allow for different layouts and/or geometries of banks of memory devices. A bank of a memory device may be comprised of multiple continuous arrays of memory cells (which continuous arrays may be alternatively referred to in the art as “MATs”) arranged between word-line drivers. Continuous arrays including tri-state memory cells may have different geometries than continuous arrays including conventional binary memory cells. The different geometries may allow for different layouts and geometries of banks. For example, banks made up of continuous arrays of tri-state memory cells, according to embodiments disclosed herein, may include fewer word-line drivers than banks made up of binary memory cells. Some embodiments relate to layouts and/or geometries of banks and/or continuous arrays of tri-state memory cells.

Although various embodiments are described herein with reference to memory devices, the disclosure is not so limited, and the embodiments may be generally applicable to microelectronic systems and/or semiconductor devices that may include memory cells. Embodiments of the disclosure will now be explained with reference to the accompanying drawings.

FIG. 1 is a functional block diagram illustrating an example memory device 100, in accordance with at least one embodiment of the disclosure. Memory device 100 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a 3D DRAM (three-dimensional DRAM). Memory device 100, which may be integrated on a semiconductor die, may include a memory array 102.

In the embodiment of FIG. 1, memory array 102 is shown as including eight memory banks BANK 0-7. More or fewer banks may be included in memory array 102 of other embodiments. Each memory bank includes a number of access lines (word lines WL), a number of bit lines (bit lines BLa and BLb), and a number of memory cells MC arranged at intersections of the number of word lines WL and the number of bit lines BLa and BLb. One or more of the of the number of memory cells MC may be a tri-state memory cell, e.g., as described in U.S. application Ser. No. 17/805,090, filed Jun. 7, 2022, the disclosure of which is incorporated by reference in its entirety.

The selection of a word line WL may be performed by a row decoder 104 and the selection of the bit lines BLa and BLb may be performed by a column decoder 106. In the embodiment of FIG. 1, row decoder 104 may include a respective row decoder for each memory bank BANK 0-7, and column decoder 106 may include a respective column decoder for each memory bank BANK 0-7.

Bit lines BLa and BLb are coupled to respective sense amplifiers SAMPa and SAMPb. Read data from bit line BLa and BLb may be amplified by the respective sense amplifiers SAMPa and SAMPb, and transferred to read/write amplifiers 160 over local input/output lines (LIOa and LIOb), transfer gates (TGa and TGb), and main input/output lines (MIOa and MIOb). Conversely, write data outputted from read/write amplifiers 160 may be transferred to sense amplifiers SAMPa and SAMPb over the main input/output lines MIOa and MIOb, transfer gates TGa and TGb, and local input/output lines LIOa and LIOb, and written in the memory cell MC coupled to bit line BLa and BLb.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit lines BLa and BLb specified by the column address YADD may be selected.

In response to active command ACT, a read signal, a row address XADD, and a column address YADD, data may be read from the memory cell MC specified by row address XADD and column address YADD. The read data may be output via sense amplifiers SAMPa and SAMPb, transfer gates TGa and TGb, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gates TGa and TGb, and sense amplifiers SAMPa and SAMPb. The write data may be written to the memory cell MC specified by row address XADD and column address YADD.

Clock signals CK and/CK may be received via clock terminals 114. A CLK input circuit 170 may generate internal clock signals ICLK based on the clock signals CK and/CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figure 2:
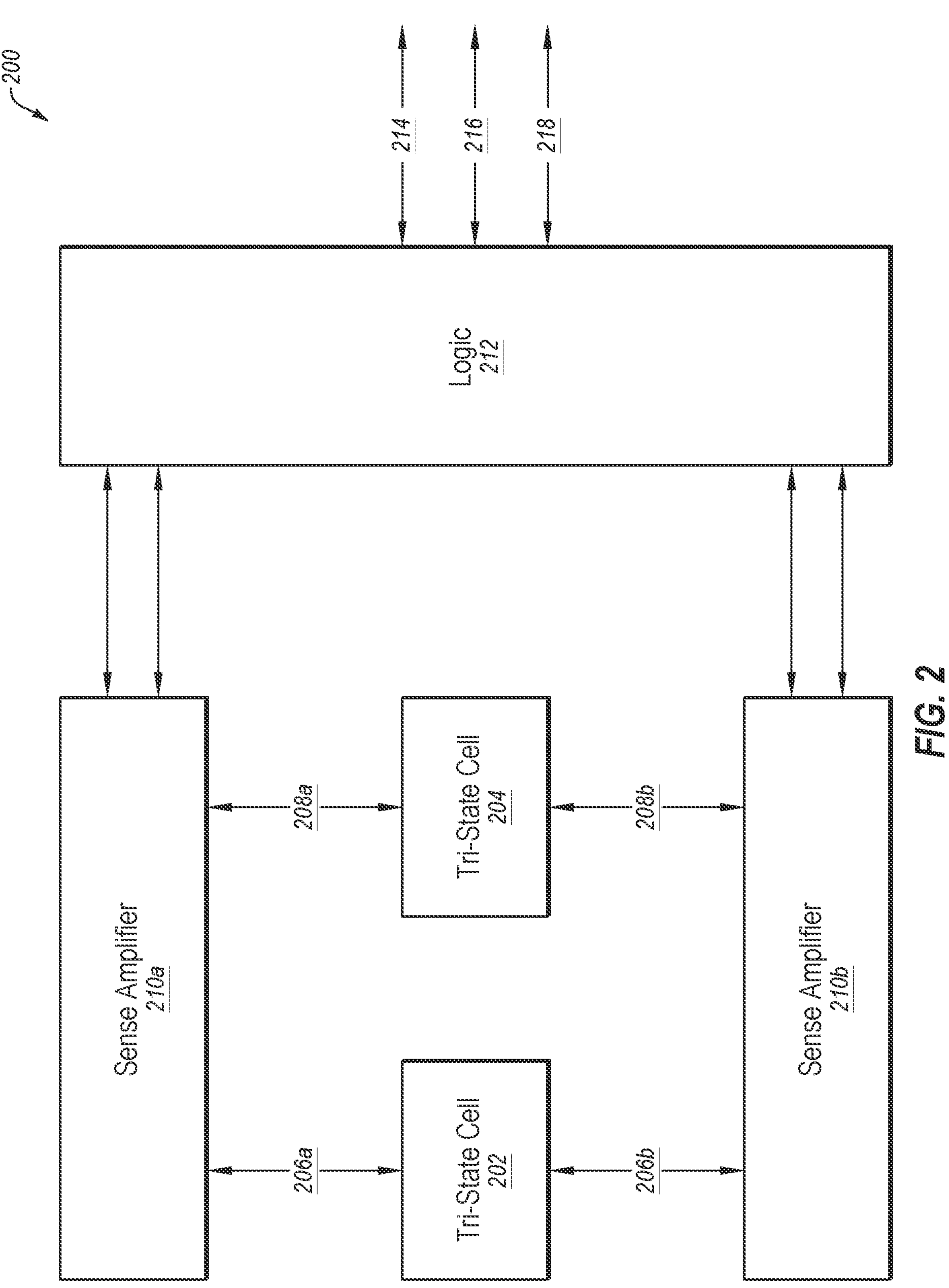
FIG. 2 is a functional block diagram illustrating another example memory device, in accordance with at least one embodiment of the disclosure.

FIG. 2 is a functional block diagram illustrating another example memory device 200 in accordance with at least one embodiment of the disclosure. Memory device 200 includes two tri-state memory cells (tri-state cell 202 and tri-state cell 204) and logic 212 to translate between voltage levels stored by the two tri-state memory cells and three binary values to be provided at respective input/output lines (input/output line 214, input/output line 216, and input/output line 218).

Tri-state cell 202 may be a first tri-state memory cell that may be configured to store a first voltage level that is one of three voltage levels. Tri-state cell 204 may be a second tri-state memory cell (e.g., of a pair of tri-state memory cells including tri-state cell 202 and tri-state cell 204) that may be configured to store a second voltage level that is one of three voltage levels (which may be the same three voltage levels or different three voltage levels). Tri-state cell 202 and tri-state cell 204 being configured to store one of three voltage levels may include accessing devices (including bit line 206*a*, bit line 206*b*, bit line 208*a*, bit line 208*b*, sense amplifier 210*a*, sense amplifier 210*b*, and logic 212) being configured to read or write the three voltage levels. Additional detail regarding the nature and configuration of tri-state memory cells is provided in U.S. application Ser. No. 17/805,090, filed Jun. 7, 2022, the disclosure of which is incorporated by reference in its entirety.

The three voltage levels stored by a tri-state memory cell may be a ground voltage, a value between the ground voltage and a supply voltage, and the supply voltage. For descriptive purposes, the three voltage levels are described herein as "0," "0.5," and "1." The three voltage levels may correspond to any suitable voltages. For example, the "0" voltage level may include any voltage less than one third (⅓) of the supply voltage, the "0.5" voltage levels may be between one third (⅓) of the supply voltage and two thirds (⅔) of the supply voltage, and the "1" voltage level may include any voltage greater than two thirds (⅔) of the supply voltage.

Tri-state cell 202 is accessed by bit line 206*a* and bit line 206*b*. Bit line 206*a* and bit line 206*b* may be a pair of bit lines, each accessing tri-state cell 202, e.g., from a different side. Bit line 206*a* is coupled to sense amplifier 210*a* and bit line 206*b* is coupled to sense amplifier 210*b*. Sense amplifier 210*a* and sense amplifier 210*b* are coupled to logic 212 and provide signals indicative of a voltage level stored by tri-state cell 202 to logic 212 or provide signals indicative of voltage levels to be stored by tri-state cell 202 to sense amplifier 210*a* and sense amplifier 210*b*. The coupling between 210*a* and logic 212 and the coupling between sense amplifier 210*b* and logic 212 may include local input/output lines (e.g., LIOa and LIOb of FIG. 1), transfer gates (e.g., TGa and TGb of FIG. 1), main input/output lines (MIOa and MIOb of FIG. 1) and/or amplifiers (e.g., RW AMP 160 of FIG. 1), among other things.

Signals carried by bit line 206*a*, bit line 206*b*, bit line 208*a*, bit line 208*b*, by lines between sense amplifier 210*a* and logic 212, and/or by lines between sense amplifier 210*b* and logic 212, may be described as binary signals. Such signals may be described as having one of two values, e.g., a "high" value or a "low" value. Such signals may alternatively be described as carrying either a "0" or a "1." Further, lines carrying such signals may be described as being "low" or "high," for example, a line carrying a "0" or a "low" value may be described as being "low" and a line carrying a "1" or a "high" value may be described as being "high."

The following table provides an example of signals carried by bit line 206*a* and bit line 206*b* that are indicative of a voltage level of tri-state cell 202.

| Voltage Level of tri-state cell 202 | Binary Value of bit line 206a | Binary Value of bit line 206b |
|---|---|---|
| 0 | 0 | 0 |
| 0.5 | 0 | 1 |
| 1 | 1 | 1 |

Tri-state cell 204 is accessed by bit line 208*a* and bit line 208*b*. Bit line 208*a* and bit line 208*b* may be a pair of bit lines, each accessing tri-state cell 204, e.g., from a different side. Bit line 208*a* is coupled to sense amplifier 210*a* and bit line 208*b* is coupled to sense amplifier 210*b*. Sense amplifier 210*a* and sense amplifier 210*b* may each include multiple sense amplifiers, e.g., one per bit line. Sense amplifier 210*a* and sense amplifier 210*b* are coupled to logic 212 and provide signals indicative of a voltage level stored by tri-state cell 204.

The following table provides an example of signals carried by bit line 208*a* and bit line 208*b* that are indicative of a voltage level of tri-state cell 204.

| Voltage Level of tri-state cell 204 | Binary Value of bit line 208a | Binary Value of bit line 208b |
|---|---|---|
| 0 | 0 | 0 |
| 0.5 | 0 | 1 |
| 1 | 1 | 1 |

Logic 212 may translate between the signals indicative of the voltage level stored by tri-state cell 202 and the voltage level stored by tri-state cell 204 and input/output signals to be provided by or received at input/output line 214, input/output line 216, and input/output line 218. Logic 212 may be included in input/output circuit 162 of FIG. 1.

There are nine possible combinations of voltage levels that can be stored by tri-state cell 202 and tri-state cell 204. There are eight possible combinations of binary signals that can be provided or received at input/output line 214, input/output line 216, and input/output line 218.

The following table provides an example of a translation between voltage levels of two tri-state memory cells (e.g., tri-state cell 202 and tri-state cell 204) and three binary values (e.g., that may be provided or received at input/output line 214, input/output line 216, and input/output line 218).

| Volt-age Level of tri-state cell 202 | Voltage Level of tri-state cell 204 | Binary Value of bit line 206a | Binary Value of bit line 206b | Binary Value of bit line 208a | Binary Value of bit line 208b | Binary Value of input/out put line 214 | Binary Value of input/out put line 216 | Binary Value of input/out put line 218 |
|---|---|---|---|---|---|---|---|---|
| 0 | 0 | 0 | 0 | 0 | 0 | 0 | 0 | 0 |
| 0 | 0.5 | 0 | 0 | 0 | 1 | 0 | 0 | 1 |
| 0 | 1 | 0 | 0 | 1 | 1 | 0 | 1 | 0 |
| 0.5 | 0 | 0 | 1 | 0 | 0 | 0 | 1 | 1 |

-continued

| Volt-age Level of tri-state cell 202 | Voltage Level of tri-state cell 204 | Binary Value of bit line 206a | Binary Value of bit line 206b | Binary Value of bit line 208a | Binary Value of bit line 208b | Binary Value of input/output line 214 | Binary Value of input/output line 216 | Binary Value of input/output line 218 |
|---|---|---|---|---|---|---|---|---|
| 0.5 | 0.5 | 0 | 1 | 0 | 1 | 1 | 0 | 0 |
| 0.5 | 1 | 0 | 1 | 1 | 1 | 1 | 0 | 1 |
| 1 | 0 | 1 | 1 | 0 | 0 | 1 | 1 | 0 |
| 1 | 0.5 | 1 | 1 | 0 | 1 | 1 | 1 | 1 |
| 1 | 1 | 1 | 1 | 1 | 1 | | | |

Memory device 200 may include any number of pairs of tri-state memory cells with corresponding bit lines and sense amplifiers. For example, memory device 200 may include any number of bit lines. Further, memory device 200 may include any number of tri-state memory cells coupled to bit line 206*a* and bit line 206*b*, each of the tri-state memory cells coupled to a respective word line.

In FIG. 2, input/output line 214, input/output line 216, and input/output line 218 are described as separate lines carrying separate signals. In other embodiments, input/output line 214, input/output line 216, and/or input/output line 218 may be configured as one line carrying all three binary signals, e.g., through time-division multiplexing.

Memory device 200, including a pair of tri-state memory cells may have a greater memory density than a conventional memory device including binary memory cells.

Figures 3, 4:
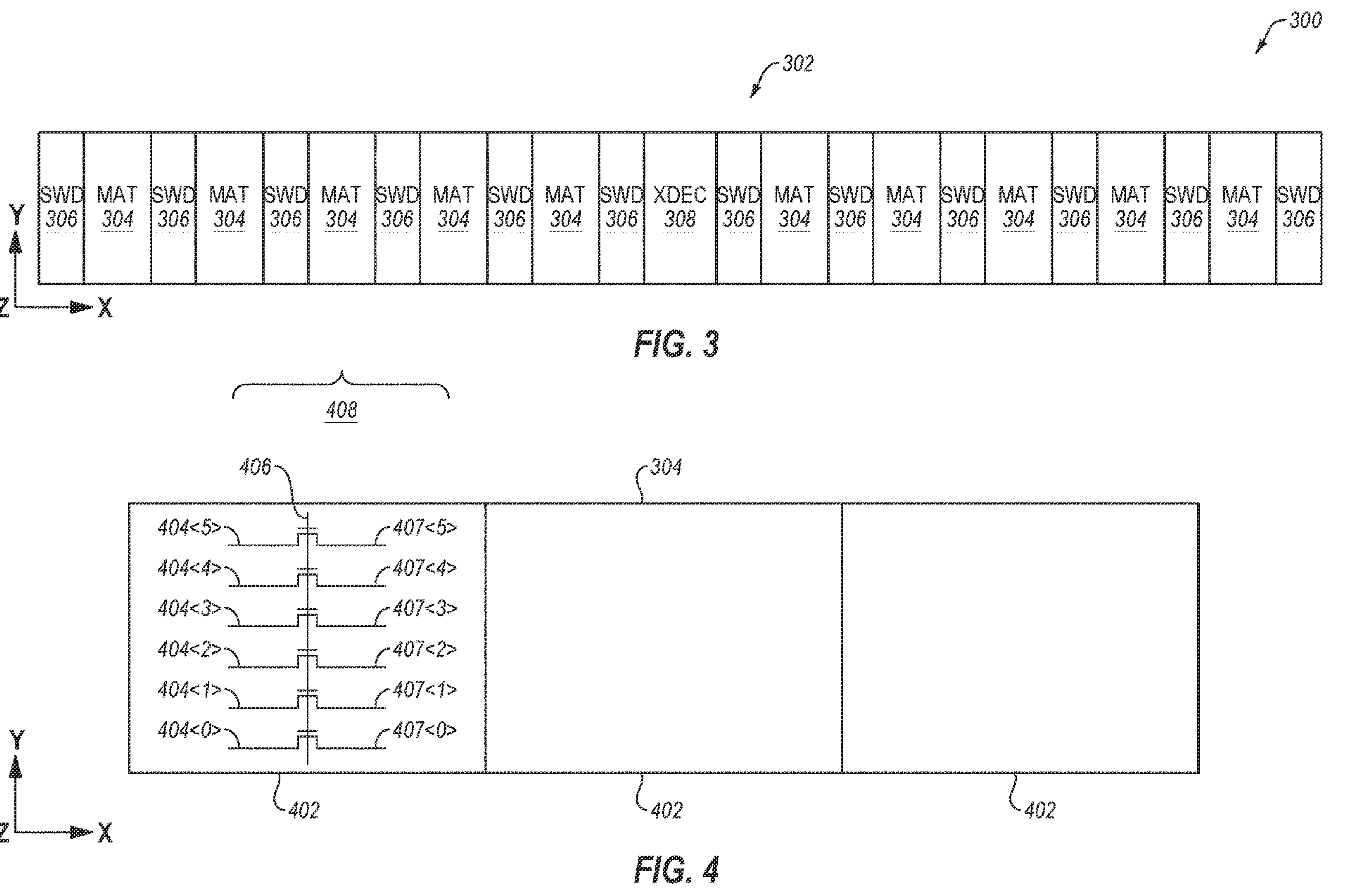
FIG. 3 is a functional block diagram illustrating yet another example memory device, in accordance with at least one embodiment of the disclosure.
FIG. 4 is a functional block diagram illustrating an example continuous array, in accordance with at least one embodiment of the disclosure.

FIG. 3 is a functional block diagram illustrating yet another example memory device 300 in accordance with at least one embodiment of the disclosure. Memory device 300 includes a bank 302 comprised of continuous arrays 304 (which continuous arrays 304 may be alternatively referred to herein as "MATs 304" or individually as "MAT 304") and sub-word-line drivers 306 (which sub-word-line drivers 306 may be alternatively referred to herein as "SWDs 306" or individually as "SWD 306") interspersed between continuous arrays 304. Bank 302 additionally includes a row decoder 308. Row decoder 308 may be an example of row decoder 104 of FIG. 1. In the embodiment illustrated in FIG. 3, bank 302 includes ten continuous arrays 304, one row decoder 308, and twelve sub-word-line drivers 306 interspersed therebetween (and on outside edges of bank 302).

FIG. 4 is a functional block diagram illustrating an example continuous array in accordance with at least one embodiment of the disclosure. Continuous array 304 of FIG. 4 may be an example of one of continuous arrays 304 of FIG. 3. In the embodiment illustrated in FIG. 4, continuous array 304 includes three column planes 402. In each of the column planes 402, each bit line 404 (e.g., bit lines 404<0>-404<5>) is coupled to a source of an associated transistor of a number of transistors, a column-select line 406 is coupled to gates of each of the number the transistors, and each local IO lines 407 (e.g., local IO lines 407<0>-407<5>) is coupled to a drain of an associated transistor of the number of transistors.

Referring to the embodiment of FIG. 3 and FIG. 4 collectively, each column plane 402 of each continuous array 304 may include tri-state memory cells (not illustrated in FIG. 3 or in FIG. 4). Each of the tri-state memory cells may be accessible by a respective bit line (e.g., bit lines 404). Each column plane 402 may include pairs of tri-state memory cells and bit lines as described with regard to FIG. 2. In the context of FIG. 3 and FIG. 4, and in the context of bank 302, continuous arrays 304, and column planes 402, a pair of bit lines (as described with regard to FIG. 2) may be described as a single bit line. For example, bit line 206*a* and bit line 206*b* may be referred to as a single bit line and bit line 208*a* and bit line 208*b* may be referred to as a separate single bit line. Each bit lines 404 may access a number of tri-state memory cells. Each of the tri-state memory cells may also be accessed by respective word lines (not illustrated in FIG. 4).

Because continuous arrays 304 includes tri-state memory cells instead of binary memory cells, bank 302 (including continuous arrays 304 of bank 302 and/or column planes 402 of continuous array 304) may have a different geometry and/or layout than conventional banks including binary memory cells while still having similar (or greater) memory capacity as compared with the conventional banks and/or while still complying with the same standards or specifications as the conventional banks.

Different specifications require different minimum parallel array access and different number of column addresses. Memory devices according to this disclosure (including tri-state memory cells) may comply with various specifications while including banks 302, continuous arrays 304, column planes 402, and/or column-select lines 406 of different geometries and/or layouts than conventional banks, continuous arrays, column planes, and/or column-select lines accessing binary memory cells. For example, continuous arrays 304 (and/or column planes 402 thereof) may be wider or narrower in an x-direction than conventional continuous arrays (and/or column planes thereof) including binary memory cells. Despite these differences, bank 302 may have a similar (or greater) memory capacity to a conventional bank; further bank 302 may comply with standards.

Some embodiment may include one hundred seventy-eight (178) (or more) bit lines 404 per column address. One hundred seventy-eight (178) (or more) bit lines 404 may correspond to one hundred seventy-eight (178) (or more) respective tri-state memory cells. One hundred seventy-eight (178) (or more) tri-state memory cells may be capable of storing two hundred sixty-seven (267) (or more) binary values, e.g., as described above with regard to FIG. 2. Thus, one hundred seventy-eight (178) (or more) tri-state memory cells, and one hundred seventy-eight (178) (or more) corresponding bit lines 404, may be capable of storing two hundred fifty-six (256) bits (plus some (e.g., nine (9)) error-correction bits) according to the JEDEC DDR5 SDRAM spec.

Some embodiments may include sixty-four (64) column-select lines 406 in each column plane 402 (e.g., one column-select line 406 corresponding to each column address) so that each column plane 402 may include bit lines 404 corresponding to each of the sixty-four (64) column addresses.

In various embodiments, the number of bit lines 404 coupled to each of the sixty-four (64) column-select line 406 may vary. Further, in various embodiments, the total number of column planes 402 may vary. Further, in various embodiments, the number of column planes 402 per continuous array 304 may vary. Further, in various embodiments, the total number of continuous arrays 304 may vary. However, all such embodiments may include sixty-four (64) column-select line 406 per column plane 402 and one hundred seventy-eight (178) (or more) bit lines 404 per column address.

In a first embodiment (illustrated in FIG. 3 and FIG. 4), each column-select line 406 may be coupled to six (6) bit lines 404. Because each column plane 402 includes sixty-four (64) column-select line 406, and each column-select line 406 is coupled to six (6) bit lines 404, each column plane 402 may include three hundred eighty-four (384) bit lines 404. In order to include one hundred seventy-eight (178) (or more) bit lines 404 per column address, such an embodiment may include thirty (30) column planes 402. Such an embodiment may include one hundred eighty (180) bit lines 404 per column address (e.g., six (6)*thirty (30)).

In the first embodiment, each column plane 402 includes three hundred eighty-four (384) bit lines 404. So that each continuous array 304 will have a suitable number of bit lines 404, each continuous array 304 may include three (3) column planes 402. In particular, it may be advantageous for each continuous array 304 to include between about one thousand (1000) and about one thousand six hundred (1600) bit lines 404, e.g., because existing sub-word-line drivers 306 may support about one thousand twenty-four (1024) bit lines. With three (3) column planes 402, and three hundred eighty-four (384) bit lines 404 per column plane 402, each continuous array 304 may include one thousand one hundred fifty-two (1152) bit lines 404.

According to the first embodiment, which includes three (3) column planes 402 in each continuous array 304, in order for bank 302 to include thirty (30) column plane 402, bank 302 may include ten (10) continuous arrays 304. Bank 302 may include twelve (12) sub-word-line drivers 306 to support the ten (10) continuous arrays 304.

The twelve (12) sub-word-line drivers 306 of the first embodiment may be fewer than the number of sub-word-line drivers included in a conventional bank of similar memory capacity. Sub-word-line drivers may be included in a bank; but the sub-word-line drivers may not include memory cells and may thus decrease a memory density of the bank. Bank 302, including fewer sub-word-line drivers 306 than are included in conventional bank of similar memory capacity may allow bank 302 to have a higher memory density than the conventional bank.

The following table summarizes some of the statistics of the first embodiment.

| Number of Bit Lines per Column-Select Line | Target Number of Bit Lines | Number of Column Planes | Number of Digit Lines | Bit Lines per Column Plane | Digit Lines per Continuous Array | Column Planes per Continuous Array | Number of Continuous Arrays | Number of Sub-Word-Line Drivers |
|---|---|---|---|---|---|---|---|---|
| 6 | 178 | 30 | 180 | 384 | 1152 | 3 | 10 | 12 |

In a second embodiment (not illustrated in FIG. 3 or FIG. 4), each column-select line 406 may be coupled to nine (9) bit lines 404. Because each column plane 402 includes sixty-four (64) column-select line 406, and each column-select line 406 is coupled to nine (9) bit lines 404, each column plane 402 may include five hundred seventy-six (576) bit lines 404. In order to include one hundred seventy-eight (178) (or more) bit lines 404 per column address, such an embodiment may include twenty (20) column planes 402. Such an embodiment may include one hundred eighty (180) bit lines 404 per column address (e.g., nine (9)*twenty (20)).

In the second embodiment, each column plane 402 includes five hundred seventy-six (576) bit lines 404. So that each continuous array 304 will have a suitable number of bit lines 404, each continuous array 304 may include two (2) column planes 402. With two (2) column planes 402, and five hundred seventy-six (576) bit lines 404 per column plane 402, each continuous array 304 may include one thousand one hundred fifty-two (1152) bit lines 404.

According to the second embodiment, which includes two (2) column planes 402 in each continuous array 304, in order for bank 302 to include twenty (20) column plane 402, bank 302 may include ten (10) continuous arrays 304. Bank 302 may include twelve (12) sub-word-line drivers 306 to support the ten (10) continuous arrays 304.

As described above, twelve (12) sub-word-line drivers 306 of the second embodiment may allow bank 302 to have a higher memory density than a conventional bank of similar memory capacity.

The following table summarizes some of the statistics of the second embodiment.

| Number of Bit Lines per Column-Select Line | Target Number of Bit Lines | Number of Column Planes | Number of Digit Lines | Bit Lines per Column Plane | Digit Lines per Continuous Array | Column Planes per Continuous Array | Number of Continuous Arrays | Number of Sub-Word-Line Drivers |
|---|---|---|---|---|---|---|---|---|
| 9 | 178 | 20 | 180 | 576 | 1152 | 2 | 10 | 12 |

In a third embodiment (not illustrated in FIG. 3 or FIG. 4), each column-select line 406 may be coupled to ten (10) bit lines 404. Because each column plane 402 includes sixty-four (64) column-select line 406, and each column-select line 406 is coupled to ten (10) bit lines 404, each column plane 402 may include six hundred forty (640) bit lines 404. In order to include one hundred seventy-eight (178) (or more) bit lines 404 per column address, such an embodiment may include eighteen (18) column planes 402. Such an embodiment may include one hundred eighty (180) bit lines 404 per column address (e.g., ten (10)*eighteen (18)).

In the third embodiment, each column plane 402 includes six hundred forty (640) bit lines 404. So that each continuous array 304 will have a suitable number of bit lines 404, each continuous array 304 may include two (2) column planes 402. With two (2) column planes 402, and six hundred forty (640) bit lines 404 per column plane 402, each continuous array 304 may include one thousand two hundred eighty (1280) bit lines 404.

According to the third embodiment, which includes two (2) column planes 402 in each continuous array 304, in order for bank 302 to include eighteen (18) column plane 402, bank 302 may include nine (9) continuous arrays 304. Bank 302 may include eleven (11) sub-word-line drivers 306 to support the nine (9) continuous arrays 304.

As described above, eleven (11) sub-word-line drivers 306 of the third embodiment may allow bank 302 to have a higher memory density than a conventional bank of similar memory capacity.

The following table summarizes some of the statistics of the third embodiment.

| Number of Bit Lines per Column-Select Line | Target Number of Bit Lines | Number of Column Planes | Number of Digit Lines | Bit Lines per Column Plane | Digit Lines per Continuous Array | Column Planes per Continuous Array | Number of Continuous Arrays | Number of Sub-Word-Line Drivers |
|---|---|---|---|---|---|---|---|---|
| 10 | 178 | 18 | 180 | 640 | 1280 | 2 | 9 | 11 |

In a fourth embodiment (not illustrated in FIG. 3 or FIG. 4), each column-select line 406 may be coupled to twelve (12) bit lines 404. Because each column plane 402 includes sixty-four (64) column-select line 406, and each column-select line 406 is coupled to twelve (12) bit lines 404, each column plane 402 may include seven hundred sixty-eight (768) bit lines 404. In order to include one hundred seventy-eight (178) (or more) bit lines 404 per column address, such an embodiment may include fifteen (15) column planes 402. Such an embodiment may include one hundred eighty (180) bit lines 404 per column address (e.g., twelve (12)*fifteen (15)).

In the fourth embodiment, each column plane 402 includes seven hundred sixty-eight (768) bit lines 404. So that each continuous array 304 will have a suitable number of bit lines 404, each continuous array 304 may include two (2) column planes 402. With two (2) column planes 402, and seven hundred sixty-eight (768) bit lines 404 per column plane 402, each continuous array 304 may include one thousand five hundred thirty-six (1536) bit lines 404.

According to the fourth embodiment, which includes two (2) column planes 402 in each continuous array 304, in order for bank 302 to include fifteen (15) column plane 402, bank 302 may include eight (8) continuous arrays 304. Bank 302 may include ten (10) sub-word-line drivers 306 to support the eight (8) continuous arrays 304.

As described above, ten (10) sub-word-line drivers 306 of the fourth embodiment may allow bank 302 to have a higher memory density than a conventional bank of similar memory capacity.

The following table summarizes some of the statistics of the fourth embodiment.

| Number of Bit Lines per Column-Select Line | Target Number of Bit Lines | Number of Column Planes | Number of Digit Lines | Bit Lines per Column Plane | Digit Lines per Continuous Array | Column Planes per Continuous Array | Number of Continuous Arrays | Number of Sub-Word-Line Drivers |
|---|---|---|---|---|---|---|---|---|
| 12 | 178 | 15 | 180 | 768 | 1536 | 2 | 8 | 10 |

The following table summarizes some of the statistics of other contemplated embodiments.

| Number of Bit Lines per Column-Select Line | Target Number of Bit Lines | Number of Column Planes | Number of Digit Lines | Bit Lines per Column Plane | Digit Lines per Continuous Array | Column Planes per Continuous Array | Number of Continuous Arrays | Number of Sub-Word-Line Drivers |
|---|---|---|---|---|---|---|---|---|
| 2 | 178 | 89 | 178 | 128 | 1024 | 8 | 12 | 14 |
| 3 | 178 | 60 | 180 | 192 | 1152 | 6 | 10 | 12 |
| 4 | 178 | 45 | 180 | 256 | 1024 | 4 | 12 | 14 |
| 5 | 178 | 36 | 180 | 320 | 1280 | 4 | 9 | 11 |
| 6 | 178 | 30 | 180 | 384 | 1152 | 3 | 10 | 12 |
| 7 | 178 | 26 | 182 | 448 | 1344 | 3 | 9 | 11 |
| 8 | 178 | 23 | 184 | 512 | 1024 | 2 | 12 | 14 |
| 9 | 178 | 20 | 180 | 576 | 1152 | 2 | 10 | 12 |
| 10 | 178 | 18 | 180 | 640 | 1280 | 2 | 9 | 11 |
| 11 | 178 | 17 | 187 | 704 | 1408 | 2 | 9 | 11 |
| 12 | 178 | 15 | 180 | 768 | 1536 | 2 | 8 | 10 |
| 13 | 178 | 14 | 182 | 832 | 1664 | 2 | 7 | 9 |
| 14 | 178 | 13 | 182 | 896 | 1792 | 2 | 7 | 9 |
| 15 | 178 | 12 | 180 | 960 | 1920 | 2 | 6 | 8 |
| 16 | 178 | 12 | 192 | 1024 | 1024 | 1 | 12 | 14 |

Figures 5, 6:
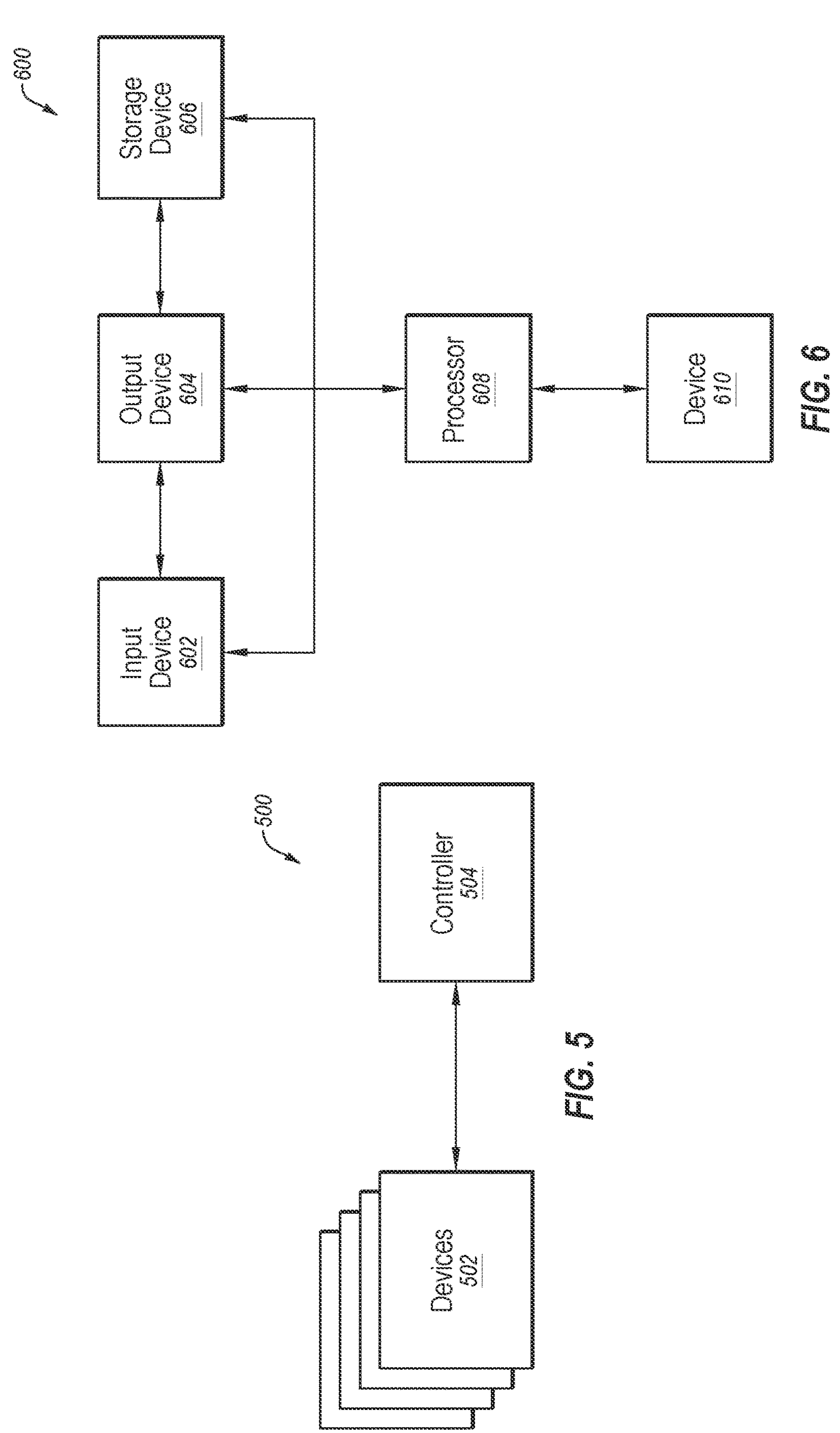
FIG. 5 is a simplified block diagram illustrating an example memory system, in accordance with at least one embodiment of the disclosure.
FIG. 6 is a simplified block diagram illustrating an example electronic system, in accordance with at least one embodiment of the disclosure.

FIG. 5 is a simplified block diagram illustrating an example memory system 500 implemented in accordance with at least one embodiment of the disclosure. Memory system 500, which may include, for example, a semiconductor device, includes a number of memory devices 502 and a controller 504. Controller 504 may be operatively coupled with memory devices 502 so as to convey command/address signals (e.g., command/address signals received by command terminals 112 and/or address terminals 110 of FIG. 1) to memory devices 502.

At least one of memory devices 502 may be, or may include, one or more of memory device 100, memory device 300 (including continuous arrays 304 as described with regard to FIG. 3 and FIG. 4) and/or memory device 200, according to one or more embodiments disclosed herein.

FIG. 6 is a simplified block diagram illustrating an electronic system 600 implemented in accordance with at least one embodiment of the disclosure. Electronic system 600 includes at least one input device 602, which may include, for example, a keyboard, a mouse, or a touch screen. Electronic system 600 further includes at least one output device 604, such as a monitor, a touch screen, or a speaker. Input device 602 and output device 604 are not necessarily separable from one another. Electronic system 600 further includes a storage device 606. Input device 602, output device 604, and storage device 606 may be coupled to a processor 608. Electronic system 600 further includes a memory device 610 coupled to processor 608. Memory device 610 may include at least a portion of memory system 500 of FIG. 5. Electronic system 600 may include, for example, a computing, processing, industrial, or consumer product. For example, without limitation, electronic system 600 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

In accordance with one embodiment, a memory device includes a first tri-state cell to store a first voltage level that is one of three voltage levels. The memory device further includes a second tri-state cell to store a second voltage level that is one of the three voltage levels. Further, the memory device includes three input/output lines to access the memory device, the three input/output lines to carry three respective binary signals based on the first voltage level and the second voltage level.

In accordance with another embodiment, a memory device includes a bank. The ban includes a number of continuous arrays of tri-state memory cells, each of the tri-state memory cells accessible by a respective bit line, groups of the bit lines associated with respective column-select lines. The bank further includes a number of sub-word-line drivers interspersed between the number of continuous arrays.

In yet another embodiment, a memory device includes a number of continuous arrays comprising respective numbers of pairs of tri-state memory cells. Each of the pairs of tri-state memory cells includes a first tri-state cell to store a first voltage level that is one of three voltage levels, the first tri-state cell accessible by a first pair of bit lines, the first pair of bit lines to carry a first two binary signals based on the first voltage level, each bit line of each first pair of bit lines coupled to a respective sense amplifier. Each of the pairs of tri-state memory cells further includes a second tri-state cell to store a second voltage level that is one of the three voltage levels, the second tri-state cell accessible by a second pair of bit lines, the second pair of bit lines to carry a second two binary signals based on the second voltage level, each bit line of each second pair of bit lines coupled to a respective sense amplifier. Further, the memory device further includes three input/output lines for each pair of tri-state memory cells, the three input/output lines to carry three binary signals based on the first voltage level and the second voltage level of the pair of tri-state memory cells. Moreover, each of the pairs of tri-state memory cells includes logic to translate respective first two binary signals and second two binary signals of a pair of tri-state memory cells into respective three binary signals and to translate the respective three binary signals into the respective first two binary signals and second two binary signals. The memory device also includes also include column-select lines associated with groups of pairs of bit lines. Further, the memory device includes a number of sub-word-line drivers interspersed between the number of continuous arrays.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device comprising:

a first tri-state cell to store a first voltage level that is one of three voltage levels;

a first pair of bit lines to access the first tri-state cell and to carry a first two respective binary signals based on the first voltage level, wherein a first bit line of the first pair of bit lines is coupled between the first tri-state cell and a first sense amplifier and a second bit line of the first pair of bit lines is coupled between the first tri-state cell and a second, different sense amplifier;

a second tri-state cell to store a second voltage level that is one of the three voltage levels;

three input/output lines to access the memory device, the three input/output lines to carry three respective binary signals based on the first voltage level and the second voltage level;

a second pair of bit lines to access the second tri-state cell and to carry a second two respective binary signals based on the second voltage level; and logic to translate the first two respective binary signals and the second two respective binary signals into the three respective binary signals and to translate the three respective binary signals into the first two respective binary signals and the second two respective binary signals;

wherein the memory device is configured such that:

when the first voltage level is a first one of the three voltage levels the first pair of bit lines are both low;

when the first voltage level is a second one of the three voltage levels, one of the first pair of bit lines is low and the other of the first pair of bit lines is high;

when the first voltage level is a third one of the three voltage levels, the first pair of bit lines are both high;

when the second voltage level is the first one of the three voltage levels, the second pair of bit lines are both low;

when the second voltage level is the second one of the three voltage levels, one of the second pair of bit lines is low and the other of the second pair of bit lines is high; and when the second voltage level is the third one of the three voltage levels, the first pair of bit lines are both high.

2. The memory device of claim 1, wherein each bit line of the second pair of bit lines is coupled to a respective sense amplifier.

3. The memory device of claim 1, wherein the second one of the three voltage levels is higher than the first one of the three voltage levels and wherein the third one of the three voltage levels is higher than the second one of the three voltage levels.

4. The memory device of claim 1, wherein the logic is configured such that:

when the first pair of bit lines are both low and the second pair of bit lines are both low, a first input/output line of the three input/output lines is low, a second input/output line of the three input/output lines is low, and a third input/output line of the three input/output lines is low;

when the first pair of bit lines are both low, the one of the second pair of bit lines is low, and the other of the second pair of bit lines is high, the first input/output line is low, the second input/output line is low, and the third input/output line is high;

when the first pair of bit lines are both low and the second pair of bit lines are both high, the first input/output line is low, the second input/output line is high, and the third input/output line is low;

when the one of the first pair of bit lines is low, the other of the first pair of bit lines is high, and the second pair of bit lines are both low, the first input/output line is low, the second input/output line is high, and the third input/output line is high;

when the one of the first pair of bit lines is low, the other of the first pair of bit lines is high, the one of the second pair of bit lines is low, and the other of the second pair of bit lines is high, the first input/output line is high, the second input/output line is low, and the third input/output line is low;

when the one of the first pair of bit lines is low, the other of the first pair of bit lines is high, and the second pair of bit lines are both high, the first input/output line is high, the second input/output line is low, and the third input/output line is high;

when the first pair of bit lines are both high and the second pair of bit lines are both low, the first input/output line is high, the second input/output line is high, and the third input/output line is low; and when the first pair of bit lines are both high and at least one of the second pair of bit lines is high, the first input/output line is high, the second input/output line is high, and the third input/output line is high.

5. A memory device comprising:

a bank comprising:

between eight and ten continuous arrays of tri-state memory cells, each of the tri-state memory cells accessible by a respective bit line, each of the continuous arrays comprising two column planes or three column planes, each of the column planes associated with sixty-four respective column-select lines, and groups of the bit lines associated with respective column-select lines, wherein each of the respective bit lines is comprised of a pair of bit lines and each of the column-select lines is associated with a respective group of from six bit lines to twelve bit lines, wherein one bit line of the pair of bit lines is coupled to a first sense amplifier and another bit line of the pair of bit lines coupled to a second, different sense amplifier; and a number of sub-word-line drivers interspersed between the number of continuous arrays.

6. The memory device of claim 5, wherein the number of continuous arrays comprises ten continuous arrays;

wherein each of the number of continuous arrays comprises three column planes; and wherein each of the column-select lines is associated with a respective group of six bit lines.

7. The memory device of claim 6, wherein the number of sub-word-line drivers comprises twelve sub-word-line drivers;

wherein each column plane is associated with three hundred eighty-four bit lines; and wherein each contiguous block is associated with one thousand one hundred fifty-two bit lines.

8. The memory device of claim 5, wherein the number of continuous arrays comprises ten continuous arrays;

wherein each of the number of continuous arrays comprises two column planes; and wherein each of the column-select lines is associated with a respective group of nine bit lines.

9. The memory device of claim 8, wherein the number of sub-word-line drivers comprises twelve sub-word-line drivers;

wherein each column plane is associated with five hundred seventy six bit lines; and wherein each contiguous block is associated with one thousand one hundred fifty-two bit lines.

10. The memory device of claim 5, wherein the number of continuous arrays comprises nine continuous arrays;

wherein each of the number of continuous arrays comprises two column planes; and wherein each of the column-select lines is associated with a respective group of ten bit lines.

11. The memory device of claim 10, wherein the number of sub-word-line drivers comprises eleven sub-word-line drivers;

wherein each column plane is associated with six hundred forty bit lines; and wherein each contiguous block is associated with one thousand two hundred eighty bit lines.

12. The memory device of claim 5, wherein the number of continuous arrays comprises eight continuous arrays;

wherein each of the number of continuous arrays comprises two column planes; and wherein each of the column-select lines is associated with a respective group of twelve bit lines.

13. The memory device of claim 12, wherein the number of sub-word-line drivers comprises ten sub-word-line drivers;

wherein each column plane is associated with seven hundred sixty eight bit lines; and wherein each contiguous block is associated with one thousand five hundred thirty-six bit lines.

14. A memory device comprising:

between eight continuous arrays and ten continuous arrays comprising respective numbers of pairs of tri-state memory cells, each of the continuous arrays comprising:

two column planes or three column planes, each column-plane associated with sixty-four respective column-select lines each associated with groups of pairs of bit lines, wherein each column plane is associated with between three hundred eighty-four pairs of bit lines and seven hundred sixty eight pairs of bit lines and wherein each of the column-select lines is associated with a respective group of between six pairs of bit lines and twelve pairs of bit lines; and each of the pairs of tri-state memory cells comprising:

a first tri-state cell to store a first voltage level that is one of three voltage levels, the first tri-state cell accessible by a first pair of bit lines, the first pair of bit lines to carry a first two binary signals based on the first voltage level, each bit line of each first pair of bit lines coupled to different sense amplifiers; and a second tri-state cell to store a second voltage level that is one of the three voltage levels, the second tri-state cell accessible by a second pair of bit lines, the second pair of bit lines to carry a second two binary signals based on the second voltage level, each bit line of each second pair of bit lines coupled to different sense amplifiers;

three input/output lines for each pair of tri-state memory cells, the three input/output lines to carry three binary signals based on the first voltage level and the second voltage level of the pair of tri-state memory cells;

logic to translate respective first two binary signals and second two binary signals of a pair of tri-state memory cells into respective three binary signals and to translate the respective three binary signals into the respective first two binary signals and second two binary signals; and a number of sub-word-line drivers interspersed between the number of continuous arrays.

15. The memory device of claim 14, wherein the number of continuous arrays comprises ten continuous arrays;

wherein each of the number of continuous arrays comprises three column planes;

wherein each column plane is associated with three hundred eighty-four pairs of bit lines; and wherein each of the column-select lines is associated with a respective group of six pairs of bit lines.

16. The memory device of claim 14, wherein the number of continuous arrays comprises ten continuous arrays;

wherein each of the number of continuous arrays comprises two column planes;

wherein each of the column planes is associated with five hundred seventy six pairs of bit lines; and wherein each of the column-select lines is associated with a respective group of nine pairs of bit lines.

17. The memory device of claim 14, wherein the number of continuous arrays comprises nine continuous arrays;

wherein each of the number of continuous arrays comprises two column planes;

wherein each column plane is associated with six hundred forty pairs of bit lines; and wherein each of the column-select lines is associated with a respective group of ten pairs of bit lines.

18. The memory device of claim 14, wherein the number of continuous arrays comprises eight continuous arrays;

wherein each of the number of continuous arrays comprises two column planes;

wherein each column plane is associated with seven hundred sixty eight pairs of bit lines; and wherein each of the column-select lines is associated with a respective group of twelve pairs of bit lines.

* * * * *